United States Patent [19]
Arai et al.

[11] Patent Number: 5,698,983
[45] Date of Patent: Dec. 16, 1997

[54] METHOD AND APPARATUS FOR MEASURING AND DISPLAYING REMAINING BATTERY CAPACITY AS A TWO DIMENSIONAL DOT CURVE

[75] Inventors: Youichi Arai; Kenichi Shimoyama; Ryo Kumagai; Yoshihide Takada, all of Shizuoka-ken, Japan

[73] Assignee: Yazaki Corporation, Tokyo, Japan

[21] Appl. No.: 628,488

[22] Filed: Apr. 5, 1996

[30] Foreign Application Priority Data

Apr. 7, 1995 [JP] Japan .................................... 7-082468
Apr. 7, 1995 [JP] Japan .................................... 7-082496

[51] Int. Cl.⁶ .................................................. G01N 27/416
[52] U.S. Cl. ........................... 324/427; 324/429; 324/433; 320/48; 340/636
[58] Field of Search ............................. 324/426, 427, 324/428, 429, 433, 771; 320/48, 44; 364/550, 551.01; 340/636

[56] References Cited

U.S. PATENT DOCUMENTS

| | | | |
|---|---|---|---|
| 4,849,700 | 7/1989 | Morioka et al. | 324/427 |
| 5,287,286 | 2/1994 | Ninomiya | 320/48 X |
| 5,321,627 | 6/1994 | Reher | 364/483 |
| 5,404,106 | 4/1995 | Matsuda | 324/431 |
| 5,473,262 | 12/1995 | Yoshimatsu | 324/429 X |
| 5,479,085 | 12/1995 | Honda et al. | 320/48 |
| 5,592,094 | 1/1997 | Ichikawa | 324/427 |

FOREIGN PATENT DOCUMENTS

08-062310   3/1996   Japan .

*Primary Examiner*—Vinh P. Nguyen
*Assistant Examiner*—Diep Do
*Attorney, Agent, or Firm*—Finnegan, Henderson, Farabow, Garrett & Dunner, L.L.P.

[57] ABSTRACT

The apparatus and method of the present invention measure the remaining capacity of a battery connected to a fluctuating load. The apparatus senses dispersive terminal voltages and dispersive discharge currents from the battery, and samples the sensed terminal voltages and discharge currents. On the basis of the sampled terminal voltages and discharge currents, the apparatus calculates a watt-hour value of the battery for a predetermined time interval, and checks whether the calculated watt-hour value reaches a predetermined value. If the calculated watt-hour value reaches the predetermined value, the apparatus calculates an approximate linear function indicative of a trend of the sampled terminal voltages and discharge currents, and calculates a voltage corresponding to a reference discharge current in accordance with the calculated approximate linear function as a remaining capacity voltage. The apparatus then converts the calculated remaining capacity voltage into an ordinate position on a two-dimensional display screen, and a calculated total watt-hour value into an abscissa position on the same display screen, and displays the positions in the form of a dot curve.

4 Claims, 9 Drawing Sheets

1

METHOD AND APPARATUS FOR MEASURING AND DISPLAYING REMAINING BATTERY CAPACITY AS A TWO DIMENSIONAL DOT CURVE

BACKGROUND OF THE INVENTION

1. Field of the Invention

The present invention relates to a remaining battery capacity measuring method and apparatus, and more specifically to the method and apparatus for displaying a remaining battery capacity precisely, in particular when there exists no strong correlation between dispersive voltages and dispersive currents of a battery to be measured.

2. Description of the Prior Art

In general, there exists a negative correlation between the dispersive voltages and the dispersive currents of a battery. In other words, when the discharge current is small, the battery voltage is high; and when the discharge current is large, the battery voltage is low, in general. Further, when the battery capacity is low, the battery voltage drops more at a constant current, as compared to when the battery capacity is high.

By utilizing the above-mentioned battery discharge characteristics, a remaining battery capacity can be estimated, as disclosed in Japanese Patent Application No. 6-200953, for instance. In this prior art method, for instance, dispersive battery voltages and dispersive battery currents flowing through various loads are sampled for each predetermined time interval. The sampled voltage and current data are averaged for each predetermined time interval. When a predetermined number of average voltage and current data have been both obtained respectively, an approximate linear function (equation) is calculated on the basis of the average voltage and current data and in accordance with the least square method and further a correlation coefficient is calculated on the basis of the average voltage and current data. When the calculated correlation coefficient is smaller than a negative reference value (i.e., a strong correlation is obtained), a voltage corresponding to a predetermined discharge current is calculated on the basis of the approximate linear function. Finally a remaining battery capacity corresponding to the voltage is estimated and displayed.

In summary, on the basis of the fact there exists a strong negative correlation (e.g., less than −0.9) between the dispersive voltages and currents of the battery, the approximate linear function is calculated by use of the average dispersive voltage and current data of the battery, and the remaining battery capacity is estimated on the basis of the calculated approximate linear function.

In the prior art remaining battery capacity measuring method, however, a problem arises when a remaining battery capacity is displayed in a digital fashion, for instance in unit of one percent by this measuring apparatus. This is because, there exists an error more than two percent in the battery capacity due to the vibration error, temperature error, sampling error, etc. In particular, when a main (traction) battery mounted on an electric vehicle is measured, since there exists such a special case there the battery is reversely charged by a regenerative current of a vehicle driving motor when the vehicle is running on a descending road, a relatively large error occurs when the discharge current is near zero.

On the other hand, when the remaining capacity of the main (or traction) battery mounted on the electric vehicle is required to be measured, since the display of the remaining battery capacity is extremely important for the driver, it is preferable to measure and display the remaining battery capacity at such a high precision as one percent or so.

To overcome this problem, it may be possible to update or display the measurement results with a hysteresis. In the case, however, the measurement precision inevitably deteriorates.

On the other hand, in order to eliminate the harmful influences of the vibration error, temperature error, sampling error, etc. on the displayed results, there exists a method of calculating an average value of the past sampling data and the present sampling data. In this method, however, there arises another problem in that additional memory units are required and further a complicated data processing program is necessary.

In summary, in the prior art remaining battery capacity measuring method as described above, when the measured remaining battery capacity is required to be displayed in digital fashion or in unit of fine gradation mark (e.g., percent or dot curve display), a measurement error is inevitably produced, thus deteriorating the reliability of the remaining battery capacity measuring apparatus.

SUMMARY OF THE INVENTION

With these problems in mind, therefore, it is the object of the present invention to provide a remaining battery capacity measuring method and apparatus, which can display a remaining battery capacity precisely and smoothly, without providing any feeling of physical disorder to the user, even when the correlation between the terminal voltages and the discharge currents of the battery is not strong (e.g., as when the discharge current is small or when the battery is reversely charged by the motor).

To achieve the above-mentioned object, the present invention provides a remaining battery capacity measuring method, comprising the steps of: sampling dispersive terminal voltages and dispersive discharge currents of a battery connected to a fluctuating load; calculating an approximate linear function indicative of a trend of the sampled dispersive terminal voltages and the sampled dispersive discharge currents; calculating a remaining battery capacity on the basis of a sampled terminal voltage corresponding to a reference discharge current and in accordance with the calculated approximate linear function; and comparing the present calculated remaining battery capacity with a preceding remaining battery capacity; and displaying the remaining battery capacity by updating the preceding remaining battery capacity in unit of a predetermined change rate on the basis of the comparison results.

Further, it is preferable that the step of displaying the remaining battery capacity comprises the steps of: when the present remaining battery capacity xa is equal to the preceding remaining battery capacity fxa (xa=fxa), not updating the preceding remaining battery capacity fxa to display the remaining battery capacity as fxa=xa; when the present calculated remaining battery capacity xa is larger than the preceding remaining battery capacity fxa (xa>fxa), updating the preceding remaining battery capacity fxa by subtracting one from the present remaining battery capacity xa to display the remaining battery capacity as $fxa=xa-1$; and when the present calculated remaining battery capacity xa is smaller than the preceding remaining battery capacity fxa (xa<fxa), updating the preceding remaining battery capacity fxa by adding one to the present remaining battery capacity xa to display the remaining battery capacity as $fxa=xa+1$.

Further, it is preferable that in the step of displaying the remaining battery capacity: the preceding remaining battery capacity fxa is updated to the present remaining battery capacity xa in unit of percentage on the basis of the comparison results as $fxa=xa\pm1\%$.

Further, it is preferable that the step of sampling dispersive terminal voltages and dispersive discharge currents comprises the steps of: detecting the dispersive terminal voltages and discharge currents for each first predetermined time interval; calculating a sum total of the detected terminal voltages and a sum total of the detected discharge currents for each second predetermined time interval longer than the first predetermined time interval; counting the number of the calculated sum totals of the terminal voltages and the discharge currents, respectively; comparing the counted number with a predetermined value; and when the counted number reaches the predetermined number, calculating the approximate linear function on the basis of a predetermined number of the sum totals of the terminal voltages and the discharge currents for each third predetermined time interval longer than the second predetermined time interval.

Further, the present invention provides a remaining battery capacity measuring apparatus, which comprises: voltage-current change trend calculating means for detecting dispersive terminal voltages and dispersive discharge currents of a battery connected to a fluctuating load; voltage-current approximate linear function calculating means for calculating an approximate linear function indicative of a trend of the detected dispersive terminal voltages and the detected dispersive discharge currents; remaining battery capacity calculating means for calculating a remaining battery capacity on the basis of a terminal voltage corresponding to a reference discharge current in accordance with the approximate linear function calculated by said voltage-current approximate linear function calculating means; display data deciding means for comparing the present calculated remaining battery capacity with a preceding remaining battery capacity, and displaying the remaining battery capacity by updating the preceding remaining battery capacity in unit of a predetermined change rate on the basis of the comparison results; and displaying means for displaying the remaining battery capacity.

Further, it is preferable that said display data deciding means comprises: first register means for storing the preceding remaining battery capacity; second register means for storing the present remaining battery capacity; data comparing means for comparing the present remaining battery capacity with the preceding remaining battery capacity; and display updating means, when the present calculated remaining battery capacity xa is larger than the preceding remaining battery capacity fxa (xa>fxa), for updating the preceding remaining battery capacity fxa by subtracting one from the present remaining battery capacity xa to display the remaining battery capacity as $fxa=xa-1$ and, when the present calculated remaining battery capacity xa is smaller than the preceding remaining battery capacity fxa (xa<fxa), updating the preceding remaining battery capacity fxa by adding one to the present remaining battery capacity xa to display the remaining battery capacity as $fxa=xa+1$.

Further, it is preferable that the preceding remaining battery capacity fxa is updated to the present remaining battery capacity xa in unit of percentage on the basis of the comparison results as $fxa=xa\pm1\%$.

Further, the present invention provides a remaining battery capacity measuring method, comprising the steps of: sampling dispersive terminal voltages and dispersive discharge currents of a battery connected to a fluctuating load; calculating a watt-hour of the battery for a predetermined time interval on the basis of the sampled terminal voltages and discharge currents; checking whether the calculated watt-hour reaches a predetermined value; if reaches the predetermined value, calculating an approximate linear function indicative of a trend of the sampled dispersive terminal voltages and the sampled dispersive discharge currents; calculating a voltage corresponding to a reference discharge current in accordance with the calculated approximate linear function as a remaining capacity voltage; converting the calculated remaining capacity voltage into an ordinate position on a two-dimensional display screen, and further a calculated total watt-hour value into an abscissa position on the same display screen; and displaying the two converted coordinates on the display screen in a form of dot curve.

Further, it is preferable that the method further comprises the steps of: whenever a dot is displayed, calculating a check voltage corresponding to a relatively high reference discharge current in accordance with the calculated approximate linear function; discriminating whether the calculated check voltage reaches a final discharge voltage or not; and when the check voltage reaches the final discharge voltage, displaying zero on the display screen.

Further, the present invention provides a remaining battery capacity measuring apparatus, which comprises: voltage-current change trend calculating means for detecting dispersive terminal voltages and dispersive discharge currents of a battery connected to a fluctuating load; discharge rate deciding means for calculating a total watt-hour on the basis of the detected dispersive terminal voltages and dispersive discharge currents, and for deciding that the calculated watt-hour reaches a predetermined value; voltage-current approximate linear function calculating means, whenever the calculated watt-hour reaches the predetermined value, for calculating an approximate linear function indicative of a trend of the detected dispersive terminal voltages and the detected dispersive discharge currents remaining battery capacity calculating means for calculating a voltage corresponding to a reference discharge current in accordance with the approximate linear function calculated by said voltage-current approximate linear function calculating means as a remaining capacity voltage; coordinate converting means for converting the calculated remaining capacity voltage into an ordinate position on a two-dimensional display screen, and further a calculated total watt-hour value into an abscissa position on the same display screen; and displaying means for displaying the two converted coordinates on the display screen in a form of dot curve.

Further, it is preferable that the apparatus further comprises a discharge end deciding means, whenever a dot is displayed, for calculating a check voltage corresponding to a relatively high reference discharge current in accordance with the calculated approximate linear function, discriminating whether the calculated check voltage reaches a final discharge voltage or not, and when the check voltage reaches the final discharge voltage, displaying zero on the display screen.

As described above, in first embodiment of the remaining battery capacity measuring method and apparatus according to the present invention, the terminal voltages and the discharge currents are sampled for a predetermined time interval; an approximate linear function is calculated on the basis of the sampled voltages and currents; and a remaining battery capacity is calculated on the basis of a voltage corresponding to a reference current along the approximate linear function. In this case, the displayed remaining battery capacity is compared with the preceding value, and the display value is always updated in units of ±1% on the basis of the comparison results. Therefore, even if the capacity data changes violently due to regenerative braking operation of the electric vehicle or others, it is possible to change the remaining battery capacity display smoothly without providing any feeling of disorder to the driver. Further, since the remaining battery capacity can be obtained without averaging the detected voltages and currents, there exists such an advantage as to reduce the memory capacity.

Further, when the display unit is composed of 100-units of light emitting elements (LEDs), for instance, it is possible to display the full percent (100%) of the battery capacity by use of these 100 LEDs. In this case, even if the remaining capacity data changes violently due to regenerative current, it is possible to display the capacity data smoothly in unit of ±1% for each measurement interval (e.g., 10 sec) without any hysteresis processing.

As described above, in the second embodiment of the remaining battery capacity measuring method and apparatus according to the present invention, the terminal voltages and discharge currents of the battery are sampled; the battery discharge rate (watt-hour) is calculated on the basis of the detected voltages and currents. Further, when the calculated discharge rate reaches a predetermined value, the approximate linear function is obtained on the basis of the sampled terminal voltages and the discharge currents. Further, a remaining capacity voltage is calculated on the basis of a reference discharge current and in accordance with the calculated approximate linear function. Further, the calculated remaining capacity voltage is converted into an ordinate position and further the calculated total watt-hour value is converted into an abscissa position on a two-dimensional display screen of the display unit.

Therefore, it is possible to display the remaining battery capacity automatically in sequence on the display screen in the form of a dot curve with the lapse of time during the travel of the vehicle. Therefore, it is possible to allow the driver to know the change of the remaining battery capacity visually with the lapse of time, even if the total battery capacity is not previously known or the correlation factor is not calculated. Further, when the remaining battery is indicated by turning on or blinking a dot on the V-Wh coordinates of the display screen, it is possible to automatically draw battery discharge characteristics on the display screen in spite of the simple apparatus construction. Further, when the battery capacity voltage reaches a final voltage, since the battery capacity voltage is reset to a numerical "0" value, the driver can well recognize the necessity of recharging the main battery.

DETAILED DESCRIPTION OF THE PREFERRED EMBODIMENTS

Prior to the detailed description of the embodiments according to the present invention, the principle and the gist of the method and apparatus of the present invention will be explained hereinbelow with reference to the attached drawing.

In accordance with the battery characteristics, when battery current is large, the battery voltage is low; and when battery current is small, the battery voltage is high. In addition, even if the battery current is the same, the battery voltage decreases with lapse of time due to power consumption of the battery.

Figure 5:
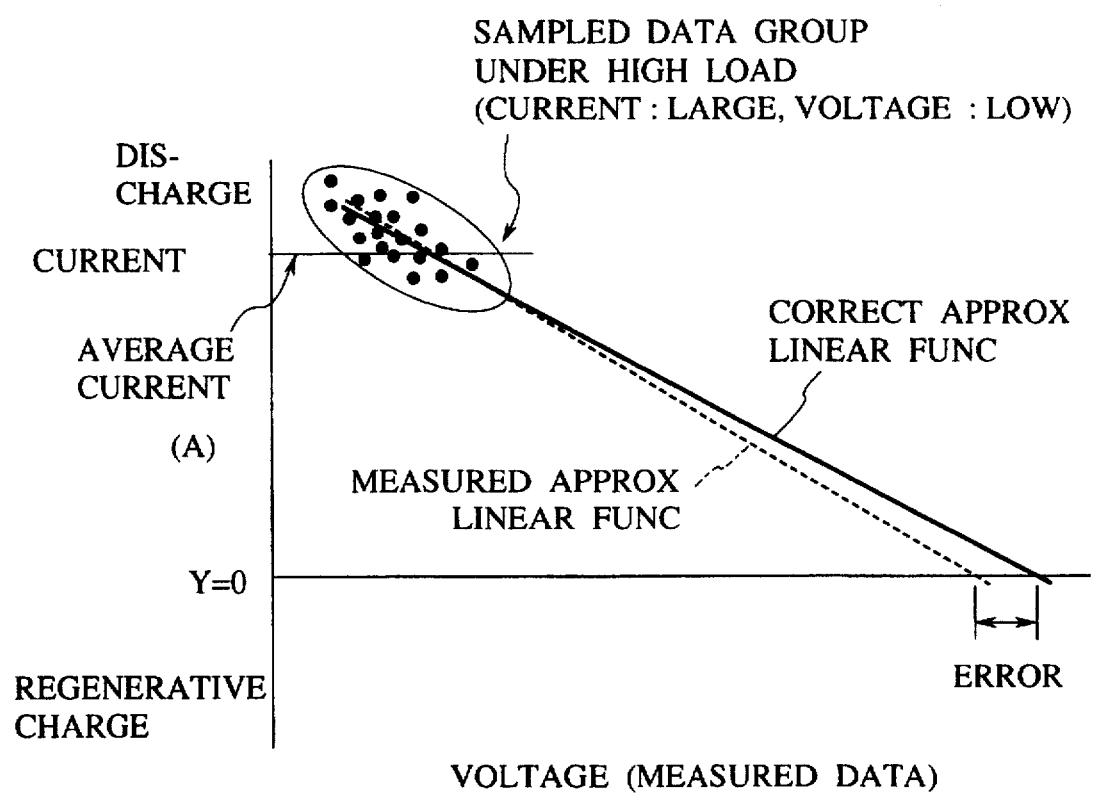
FIG. 5 is a graphical representations for assistance in explaining some erroneous correlation between the currents and voltages of the main battery mounted on an electric vehicle, respectively.

Therefore, the above-mentioned facts indicate the following two battery characteristics:

(1) There exists a negative correlation between the dispersive terminal voltages and the dispersive discharge currents of the battery as shown in FIG. 5. In this case, since the approximate linear function indicative of a trend of the dispersive terminal voltage and discharge current data is usually calculated on the basis of the many data obtained when the battery is being discharged under a constant relatively high load (as when the electric vehicle is running at a constant speed under a high load continuously), although the sampled voltages and currents disperse, since the change in gradient of the approximate liner function is relatively small, the error of the approximate linear function is relatively small when the discharge current is high. However, the error of the approximate linear function is relatively large when the discharge current is small. In other words, the error of the approximate linear function increases with decreasing discharge current or the increasing terminal voltage of the battery, as shown in FIG. 5. In particular, when main battery mounted on an electric vehicle is required to be measured, since the battery is reversely charged by a regenerative current of a driving motor when the electric vehicle is running on a descending load, for instance, there inevitably exists an error as large as±two or several percent in a measurement range where the battery terminal voltage is roughly zero.

Therefore, in the present invention, the measured results are not simply displayed as it is in particular when the discharge current is small.

(2) Further, as already explained, since the above-mentioned approximate linear function changes with increasing consumption of the battery, once a precise approximate linear function indicative of a trend of the dispersive battery voltages and currents can be obtained, a remaining battery capacity can be obtained and therefore updated on the basis of the detected voltage corresponding to a reference current along the obtained approximate linear function.

A first embodiment of the remaining battery capacity measuring apparatus according to the present invention will be described hereinbelow with reference to the attached drawings, by taking the case where applied to measure the remaining capacity of a main battery mounted on an electric vehicle.

Figure 1:
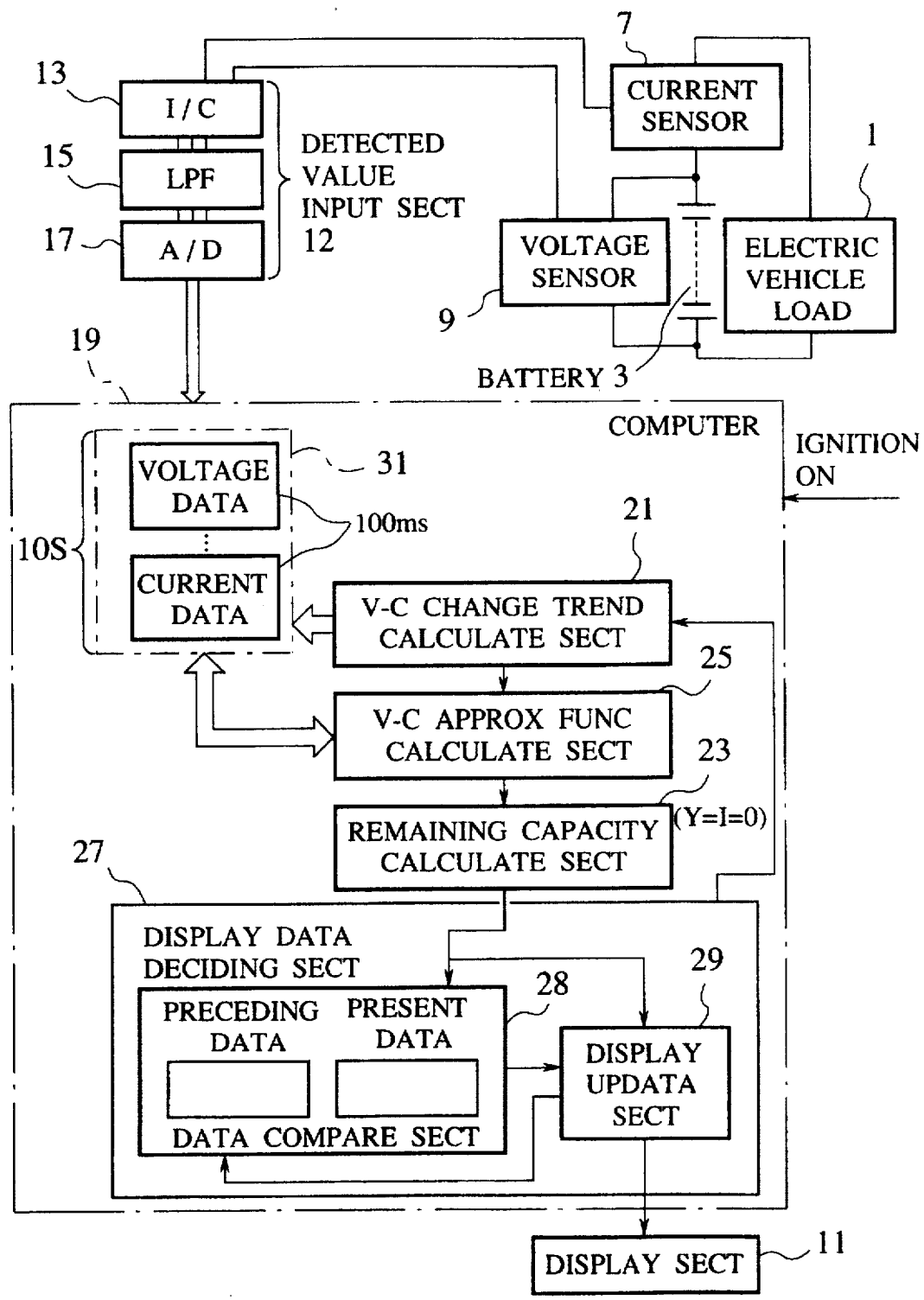
FIG. 1 is a block diagram showing a first embodiment of the remaining battery capacity measuring apparatus according to the present invention.

In FIG. 1, the measuring apparatus is roughly composed of a main battery 1, a battery current sensor 7 and a voltage sensor 9, a detected value inputting section 12, a computer 19, and a display unit 11.

In more detail, the main battery 3 is connected to a load (e.g., motor) 1 of an electric vehicle. Further, the current sensor 7 is connected in series to the battery 3 to detect dispersive currents flowing through the battery 3, and the voltage sensor 9 is connected in parallel to the battery 3 to detect dispersive terminal voltages of the battery 3.

The detected value inputting section 12 comprises an input/output interface 13, a low-pass filter (LPF) 15, and an analog-digital converter (A/D) 17. Detected dispersive battery terminal voltages and discharge currents are inputted to the detected value inputting section 12 from the current sensor 7 and the voltage sensor 9, to remove noise from the dispersive voltages and dispersive currents and to convert the inputted analog signals to digital signals corresponding thereto, respectively.

The computer 19 is provided with such software functions which correspond to such hardware functions as a voltage-current change trend calculating section 21, a remaining battery capacity calculating section 23, a voltage-current approximate linear function calculating section 25, a display data decision section 27, etc. The computer 19 is activated by a power supplied from a subsidiary battery, whenever an ignition key is turned on.

When the computer is activated, a CPU of the computer samples the detected digital dispersed voltage and current data from the voltage-current change trend calculating section 21, and stores the sampled data in a memory 31 for each first predetermined time interval (e.g., 1 ms). Further, the CPU calculates a sum total of a predetermined number (e.g., 100 units) of the sampled dispersive voltage data and a sum total of a predetermined number (e.g., 100 units) of the sampled dispersive current data, for each second predetermined time interval (e.g., 100 ms). The calculated sum total values of the voltage and current data are stored in the memory 31.

The voltage-current approximate linear function calculating section 25 reads a plurality (e.g., 100 units) of sum total voltage data and a plurality (e.g., 100 units) of sum total current data from the memory 31 for each 10 sec, to calculate a voltage-current approximate linear equation ($Y=aX+b$) for each 10 sec in accordance with the least square method (a sum total of squares of the errors between the calculated values and the actually measured values is minimized) (described in detail later).

Whenever the voltage-current approximate linear function calculating section 25 obtains the voltage-current approximate linear equation ($Y=aX+b$), the remaining battery capacity calculating section 23 specifies a voltage value X on the voltage-current coordinates on the basis of a previously determined (reference) discharge current value Y and in accordance with the obtained approximate linear equation ($Y=aX+b$); and displays the specified voltage value X on the display unit 11 as a remaining battery capacity.

Further, the display data deciding section 27 is composed of a data comparing section 28 and a display updating section 29. Once a remaining battery capacity is obtained, the data comparing section 28 stores the obtained battery capacity in a display register (not shown), compares the present data with the stored previous data, and applies the comparison result to the display updating section 29.

On the basis of the comparison result (the remaining battery capacity) calculated by the remaining capacity calculating section 23, the display updating section 29 increases or decreases the display data only in unit of minimum display (e.g., 1%), and updates the preceding display data stored in the display register of the data comparing section 28 and now being displayed on the display unit 11, respectively. Here, the display unit 11 is a digital display composed of some segments of dots. Instead of the segment type display, it is also possible to use a display unit composed of a number (e.g., 100 units) of light emitting diodes (LEDs). In this case, when the battery is new and therefore has a full percentage (100%) capacity, all the LEDs are lit up.

Figure 2:
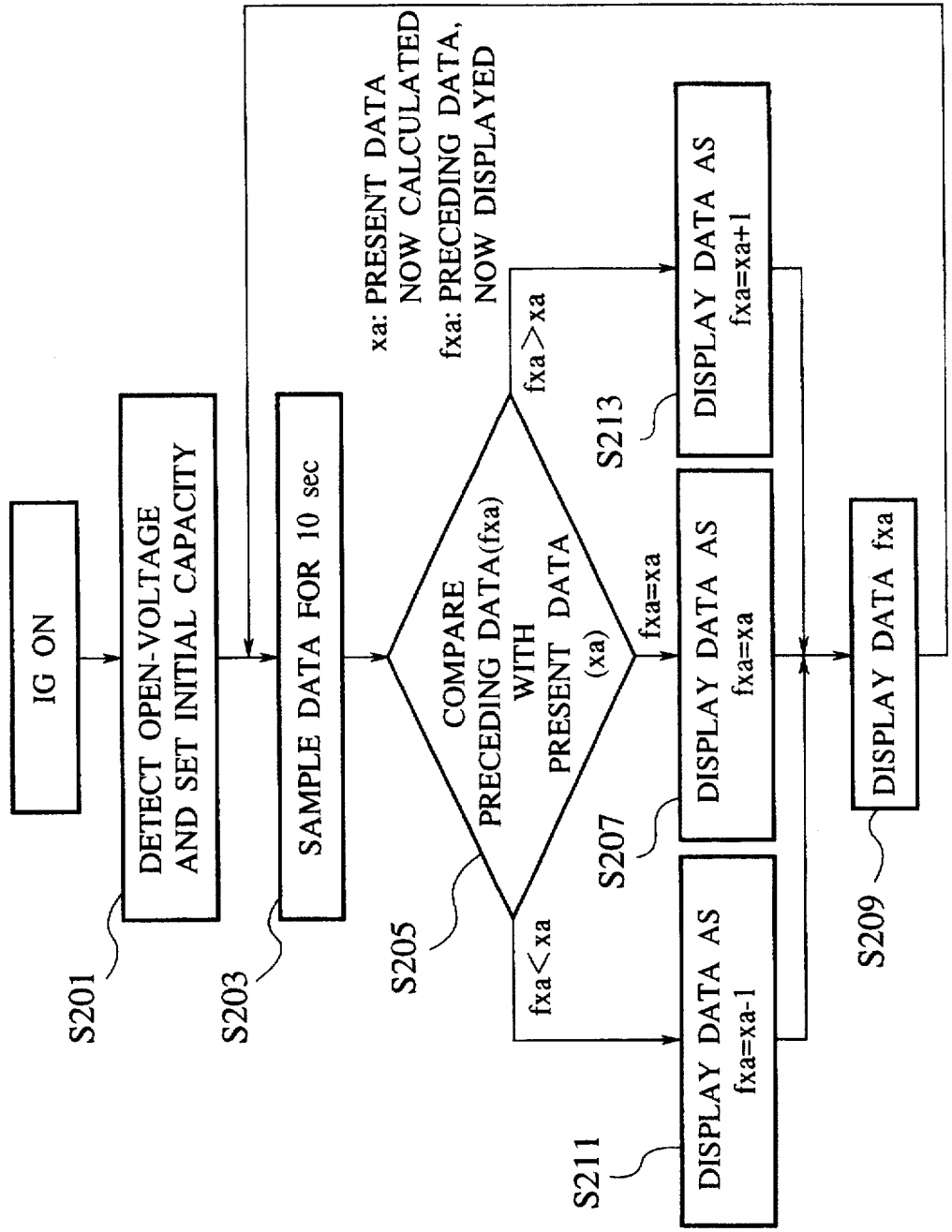
FIG. 2 is a flowchart for assistance in explaining the operation of the first embodiment of the remaining battery capacity measuring apparatus shown in FIG. 1.

The operation of the above-mentioned remaining battery capacity measuring apparatus will be described in further detail hereinbelow with reference to a flowchart shown in FIG. 2.

Whenever the ignition switch is turned on, the CPU reads an open-circuit voltage of the battery detected by the voltage sensor 9, and sets a remaining battery capacity corresponding to the present open-circuit voltage as an initial remaining capacity xa. Further, the CPU displays the set initial remaining capacity on the display unit in unit of percentage For each 10 sec interval (in step S201). Here, the open-circuit voltage implies a battery terminal voltage obtained when the electric vehicle is still kept stopped immediately after the ignition switch has been turned on, so that the battery load is not yet fluctuating. Therefore, the initial remaining capacity can be calculated accurately on the basis of the initial terminal voltage, without any fluctuations.

Further, after the electric vehicle starts running, the CPU samples the battery terminal voltages detected by the voltage sensor 9 and the battery discharge currents flowing through the load 1 and detected by the current sensor 7 for each 1 ms. Further, on the basis of the obtained terminal voltages and the discharge currents, the CPU calculates a sum total of the sampled voltage data and a sum total of the sampled current data for each 100 ms. Further, on the basis of the calculated sum totals of the voltage and current data, the CPU calculates an approximate linear function indicative of a trend of the detected terminal voltages and the discharge currents for each 10 sec. Further, the remaining battery capacity is calculated on a basis of the terminal voltage corresponding to a reference discharge current along the calculated approximate liner function in unit of percentage relative to a full capacity (100%) (in step S203).

Further, the CPU compares the present percent display data (xa) with the preceding percent data (fxa) now being displayed (in step S205). If the present percent data (xa) is equal to the preceding percent data (fxa), the CPU displays the preceding data (fxa=xa) as it is without replacing the preceding data (fxa) with the present data (xa) (in step S207).

Further, when the CPU discriminates that the present percent data (xa) is larger than the preceding displayed percent data (xa>fxa) (in step S205), the CPU subtracts one percent from the present data (xa) and displays the subtraction result (fxa=xa−1) (in step S211). In more practical way, when the preceding remaining battery capacity now being displayed is fxa=95% and the present capacity now calculated is fx=97%, 96=(97−1)% is displayed.

Further, when the CPU discriminates that the present percentage data (xa) is smaller than the preceding displayed percent data (xa<fxa) (in step S205), the CPU adds one percent to the present data (xa) and displays the addition result (fxa=xa+1) (in step S218). In more practical way, when the preceding remaining battery capacity now being displayed is fxa=97% and the present capacity now calculated is xa=95%, 96=(95+1)% is displayed.

In summary, when the battery capacity increases, the capacity is displayed after one is subtracted therefrom; and when the battery capacity decreases, the capacity is displayed after one is added thereto, in order to display a large capacity change only within the minimum change rate (±1%).

This is because even if there exists an error of the approximate linear function, the error is usually less than 2%, so that the remaining battery capacity can be displayed by increasing or decreasing the capacity by only ±1%.

Further, even if an increase or decrease more than 1% is correct, since the remaining capacity of the main battery hardly changes more than 2% only during 10 sec, as far as the remaining battery capacity is displayed for each 10 sec, there exists no large difference between the actual capacity data and the display capacity data.

Figure 3:
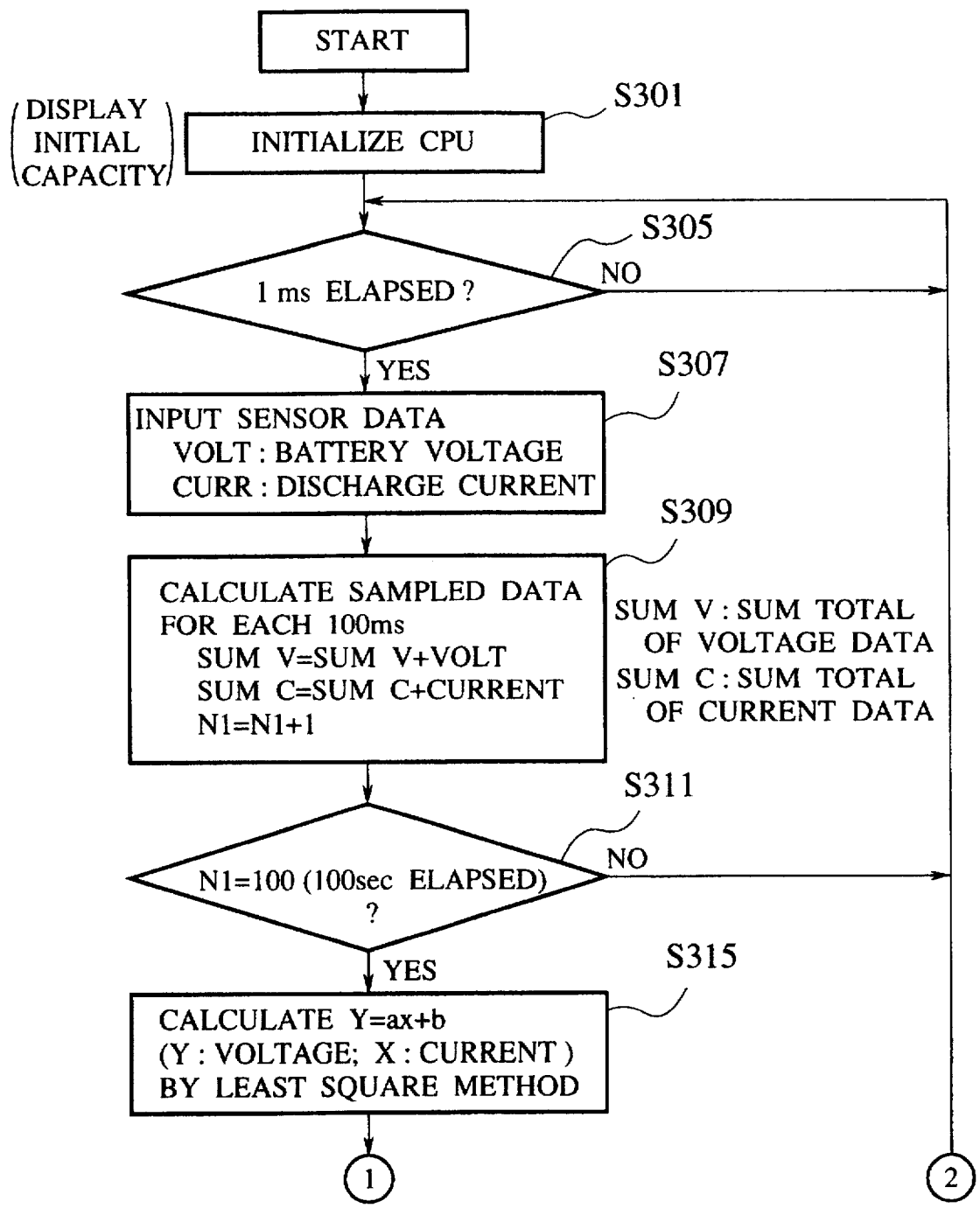
FIG. 3 is a more detailed flowchart for assistance in explaining the operation of the first embodiment of the remaining battery capacity measuring apparatus shown in FIG. 1.
Figure 4:
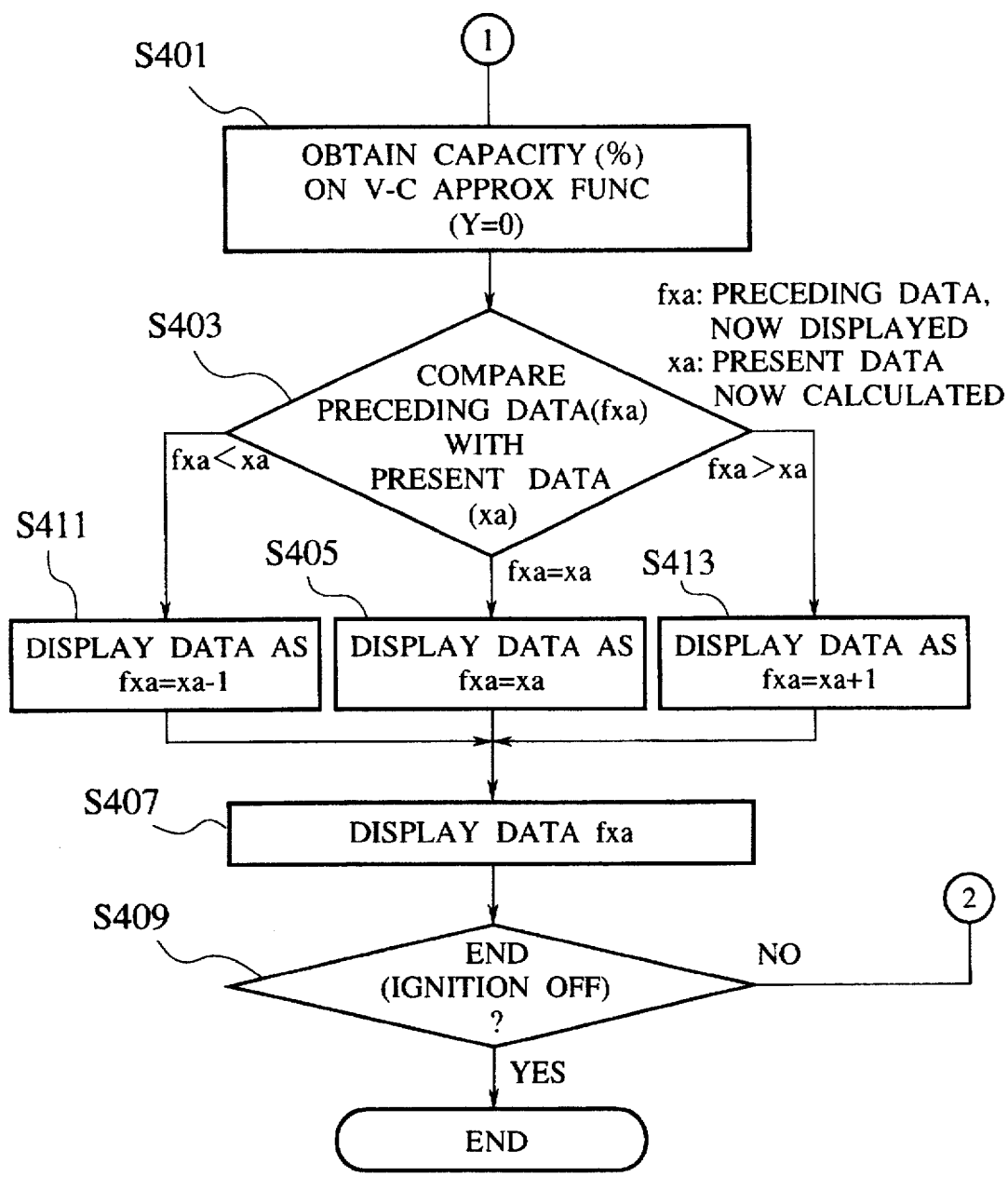
FIG. 4 is a similar more detailed flowchart for assistance in explaining the operation of the first embodiment of the remaining battery capacity measuring apparatus shown in FIG. 1, which is connected to FIG. 3.

The operation of the remaining battery measuring apparatus according to the present invention will be described in further detail with reference to FIGS. 3 and 4.

When the ignition key is turned on, the CPU (the remaining capacity calculating section 23) is activated by a supply voltage of a subsidiary battery to check the respective sections and to initialize the CPU (e.g., transfers a program stored in a ROM to a RAM) (in step S301). Further, the CPU reads the voltages under no-load conditions, calculates an initial remaining battery capacity corresponding to the no-load voltage, and displays the calculated capacity on the display section 11 (in step S301).

Then, the CPU (the voltage-current change trend calculating section 21) discriminates whether 1 ms has elapsed (in step S305).

If 1 ms has elapsed, the CPU (the voltage-current change trend calculating section 21) reads the sensor data such as terminal voltages (VOLT) and discharge currents (CURR) from the detected value inputting circuit section 12, and stores the read data in the memory 81 (in step S307).

Further, when N1(100)-units of terminal voltages and discharge currents have been obtained for 100 ms, the CPU (the voltage-current change trend calculating section 21) calculates a sum total (SUM V) of the detected voltage data and a sum total (SUM C) of the detected current data (in step S309). The above-mentioned calculations are repeated for 10 sec. The obtained average values are both stored in the memory 31 (in step S309).

Further, the CPU counts the number of the reading and storing operations, and discriminates whether the count value N1 reaches 100, that is, 10 sec has elapsed (in step 311). If not yet elapsed, the CPU returns to step S305 to repeat the above operation, until the 100-units of the sum totals of both the voltage and current data can be obtained for 10 sec on the basis of the 100-units of sampled voltages and currents obtained for 1 ms. As described above, a plurality (100 units) of sum total values of voltage data (SUM V) and a plurality (100 units) of sum total values of current data (SUM C) can be obtained for each 10 sec, respectively. The obtained sum total voltage and current data are stored in the memory 31.

Further, the CPU (the voltage-current approximate linear function calculating section 25) calculates an approximate linear function indicative a trend of the average voltage and current data in accordance with the least square method (in step S315).

In more detail, the coefficients a and b of a linear equation of ($Y=aX+b$) can be obtained by the least square method as follows:

Here, if a sum total of squares of the error between the calculated values and the actually measured values is denoted by S $$S = \Sigma(Yi - (a\,Xi + b))^2$$

On the basis of the above equation, a solution of when the values obtained by differentiating S with respect to a and b become zeros, respectively are obtained as follows:

$$\partial S/\partial b = 2\sum_{i=1}^{n} b + 2\sum_{i=1}^{n} Xia - 2\sum_{i=1}^{n} Yi = 0$$

$$\partial S/\partial a = 2\sum_{i=1}^{n} Xib + 2\sum_{i=1}^{n} X^2 a - 2\sum_{i=1}^{n} XiYi = 0$$

By establishing the above two simultaneous equations, the following formulae can be obtained as $$a = \frac{\sum_{i=1}^{n} XiYi - \left(\sum_{i=1}^{n} Xi \sum_{i=1}^{n} Yi\right)/n}{\sum_{i=1}^{n} Xi^2 - \left(\sum_{i=1}^{n} Xi\right)^2/n}$$

$$b = \sum_{i=1}^{n} Yi/n - 2\sum_{i=1}^{n} Xi(a/n)$$

As a result, it is possible to obtain X (voltage) value on the basis of Y (current) at any time in accordance with the linear equation as $$X = (Y - b)/a$$

Further, the CPU (the remaining capacity calculating section 23) calculates a percent (%) of the remaining battery capacity on the basis of the sampled voltage value corresponding to a reference current (0 A, in this embodiment) along the calculated voltage-current linear equation $Y=aX+b$ (in step S401).

Further, the CPU (the data comparing section 28) compares the present percent data (xa) now calculated with the preceding percent data (fxa) now being displayed (in step S403).

Here, if the present percent data (xa) is the same as the preceding data (fxa) (in step S403), the CPU determines the present percent data (xa) as the display data (fxa) as (fxa=xa) (in step S405). If the present percent data (xa) is larger than the preceding displayed percent data (xa>fxa) (in step S403), the CPU subtracts one percent from the present percent data (xa) and determines the subtraction result as the display data (fx) as (fxa=xa−1) (in step S411). Further, if the present percent data (xa) is smaller than the preceding displayed percent data (xa<fxa) (in step S403), the CPU adds one percent to the present percent data (xa) and displays the addition result (fxa=xa+1) (in step S413).

The CPU displays the determined remaining battery capacity fxa on the display unit 11 (in step S407). Further, the CPU discriminates whether the ignition switch is turned off or not (in step S409). If turned off, the CPU ends the control. If not turned off, the CPU returns to the step (S305) shown in FIG. 3, repeating the above-mentioned process.

In this process, even if there exists an error when the approximate linear function is obtained, since the error will not exceed ±2%, it is possible to the remaining battery capacity within an error range of ±1%. Further, since 100 units of the detected voltages and currents are added further divided by 100 to obtain average values for each 10 sec, it is possible to reduce the memory capacity.

Further, in the above-mentioned embodiment, although the remaining battery capacity measuring apparatus has been described by taking the case when applied to the apparatus for measuring a main battery mounted on an electric vehicle, it is of course possible to apply the method and apparatus according to the present invention to various apparatus provided with a battery whose discharge current varies violently or stably without fluctuations.

Further, in the above-mentioned embodiment, the data collecting time is determined as 10 sec, the data collection time can be determined freely according to the apparatus.

Further, in the remaining battery capacity measuring method and apparatus according to the present invention, although the voltage-current approximate linear function is calculated immediately after 10 sec has elapsed. It is also possible to add the step of calculating the correlation coefficient between the detected voltages and currents and to execute the steps of S315 and after only when the calculated correlation coefficient is less than −0.9 (i.e., only when a strong correlation can be obtained).

Further, in the above embodiment, although the display unit 11 of segment type is used, it is of course possible to use a number of light emitting diodes (LED), instead of liquid crystal display (LCD).

As described above, in first embodiment of the remaining battery capacity measuring method and apparatus according to the present invention, the terminal voltages and the discharge currents are sampled for a predetermined time interval; an approximate linear function is calculated on the basis of the sampled voltages and currents; and a remaining battery capacity is calculated on the basis of a voltage corresponding to a reference current along the approximate linear function. In this case, the displayed remaining battery capacity is compared with the preceding value, and the display value is always updated in unit of ±1% on the basis of the comparison results. Therefore, even if the capacity data changes violently due to regenerative braking operation of the electric vehicle or others, it is possible to change the remaining battery capacity display smoothly without providing any feeling of disorder to the driver. Further, since the remaining battery capacity can be obtained without averaging the detected voltages and currents, there exists such an advantage as to reduce the memory capacity.

Further, when the display unit is composed of 100-units of light emitting elements (LEDs), for instance, it is possible to display the full percent (100%) of the battery capacity by use of these 100 LEDs. In this case, even if the remaining capacity data changes violently due to regenerative current, it is possible to display the capacity data smoothly in unit of ±1% for each measurement interval (e.g., 10 sec) without any hysteresis processing.

A second embodiment of the remaining battery capacity measuring method and apparatus according to the present invention will be described hereinbelow with reference to the attached drawings. The feature of this second embodiment is to display the remaining battery capacity in the form of the remaining capacity voltage and the discharged capacity (i.e., consumed watt-hour) in two-dimensional display screen.

Prior to the description of the second embodiment, some problems related to the measuring method will be explained.

When the remaining capacity of a main battery mounted on an electric vehicle is required to be obtained, it is usual to calculate a present capacity and further to subtract the calculated present capacity from a total battery capacity previously estimated. Therefore, the total capacity of the main battery must be calculated under due considerations of the battery deterioration, battery temperature, discharge dispersion according to the sort of the battery, etc.

By the way, as the method of calculating the total battery capacity, there exists such a method of predicting the discharge characteristics from the present running voltage and current status to the zero capacity, and then obtaining a total battery capacity on the basis of the predicted discharge characteristics. In this method, however, since the total battery capacity is estimated on the basis of a regressive curve, the calculation precision is not high. Further, when the calculated total capacity is required to be corrected, a complicated processing such as learning function, etc. is necessary.

Therefore, conventionally, as already explained, the terminal voltages V and the discharge currents I of the battery are measured for each 1 ms. 100-units of the measured voltage and current data are averaged for each 100 ms and then stored in a memory, respectively. A correlation coefficient between the terminal voltages and the discharge currents is calculated on the basis the 100-units of the averaged voltage and current data (referred to as dispersive voltage and current data). Only when a strong correlation is obtained between the voltage and current data, an approximate linear function or equation ($Y=aX+b$ Y:current X:voltage) is calculated. A voltage X is specified by substituting any given value for Y of this approximate linear function. The obtained voltage X is displayed as a remaining capacity voltage corresponding to the present remaining battery capacity (representative of the remaining capacity). Further, when the terminal voltage changes violently or when the terminal voltage reaches a final discharge voltage, a relatively large value (e.g., 7A) is substituted for Y, to obtain a more accurate remaining capacity voltage.

However, it is preferable to display the remaining battery capacity as the remaining rate rather than the present battery capacity voltage, because the driver can know a travel distance by use of the present battery more directly by his visual sense or feeling.

However, since the total battery capacity is not known, even if the remaining capacity voltage can be specified along the calculated approximate linear function, there exists a problem in that it is difficult to known the remaining battery capacity accurately.

In addition, when the remaining battery capacity is calculated, since the influence of the discharge dispersion, the battery deterioration, the temperature, etc. must be taken into account, there exists another problem in that the measurement program has been complicated.

Further, the correlation coefficient between the battery terminal voltages and the discharge currents is susceptible to the influence of the filter characteristics (i.e. set values) for eliminating noise (unnecessary components) of the detected voltages and currents. Therefore, when the filter characteristics disperse, the obtained voltages are not necessarily accurate. Further, once the detected voltages have been converted into digital signals, since the past values cannot be estimated, there exists another problem in that it is difficult for the driver to estimate the correct remaining battery capacity on the basis of the displayed remaining capacity.

The second embodiment of the remaining battery capacity measuring method and apparatus according to the present invention will be described hereinbelow with reference to FIGS. 6 to 9.

Figure 6:
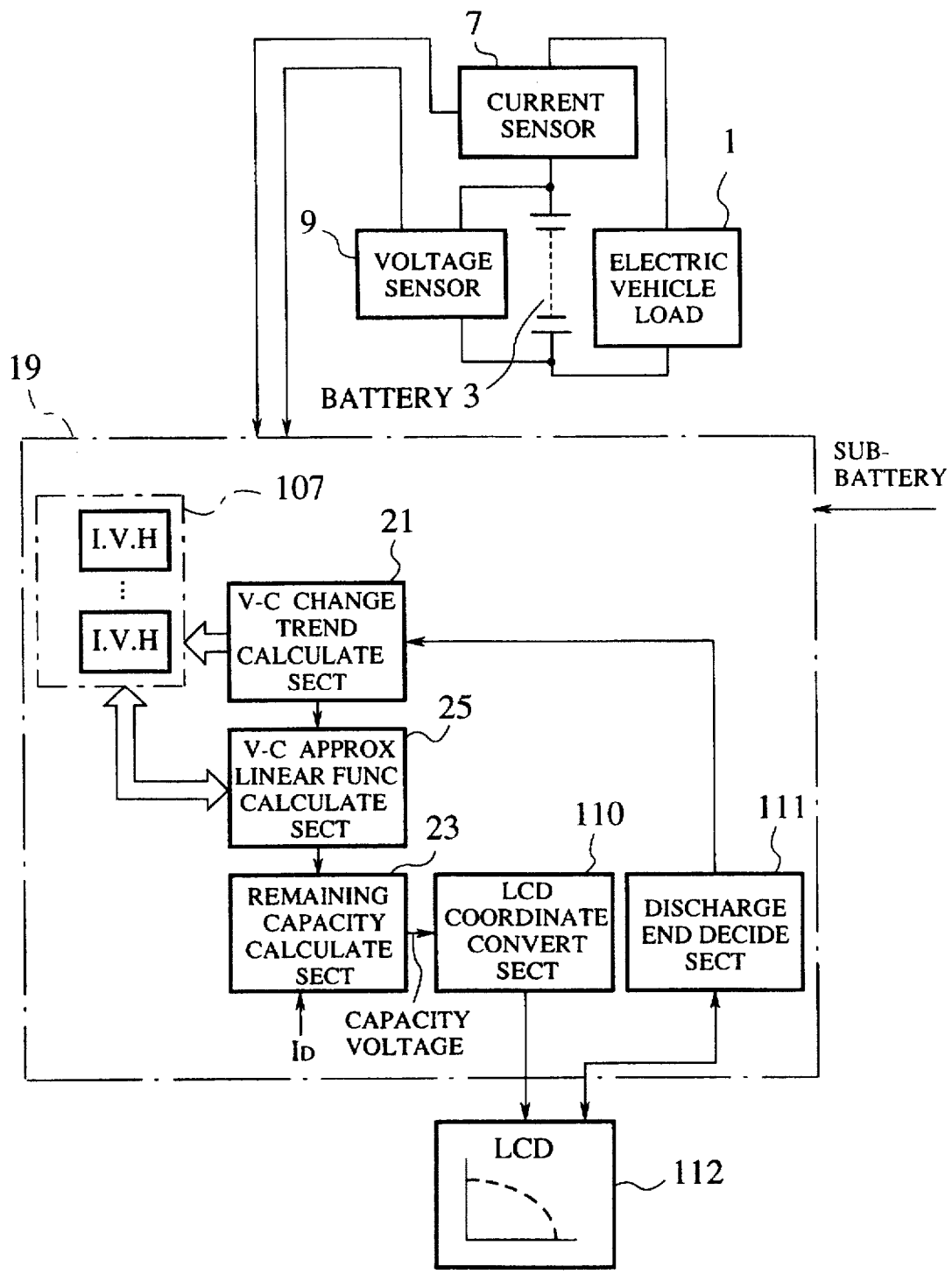
FIG. 6 is a block diagram showing a second embodiment of the remaining battery capacity measuring apparatus according to the present invention.

In FIG. 6, in the same way as with the case of the first embodiment shown in FIG. 1, the measuring apparatus comprises an electric vehicle load 1 (e.g., a motor), a main (or traction) battery 3, a non-contact type voltage sensor 9, a non-contact type current sensor 7, and a computer 19. Further, the computer 19 is provided with such software functions which correspond to such hardware functions as a voltage-current change trend calculating section 21, a voltage-current approximate linear function calculating section 25, and a remaining capacity calculating section 23.

An approximate linear function can be obtained on the basis of a plurality of detected voltages and detected currents. Further, the remaining battery capacity can be obtained on the basis of the calculated approximate linear function, as already explained in the first embodiment. In this second embodiment, however, the measuring apparatus comprises a discharge rate (watt-hour) deciding section 107, an LCD (liquid crystal display) coordinate converting section 110, and a discharge end deciding section 111, and an LCD unit 112, being different from the first embodiment.

In more detail, a discharge rate (watt-hour) of the battery can be obtained by a product of the detected voltage and current and the detection time. Therefore, when the obtained discharge rate reaches a predetermined value (after the vehicle has travelled at a predetermined distance), the discharge rate deciding section 107 outputs a signal indicative of a constant discharged rate (watt-hour). Further, in response to this constant watt-hour signal, the voltage-current approximate linear function calculating section 8 calculates an approximate linear function ($Y=aX+b$).

Further, on the basis of the calculated approximate linear function, the remaining battery capacity calculating section 8 substitutes a reference current $I_0$ for Y of the approximate linear function, to specify the terminal voltage (which corresponds to the remaining capacity voltage) of the present battery 3.

Figure 9:
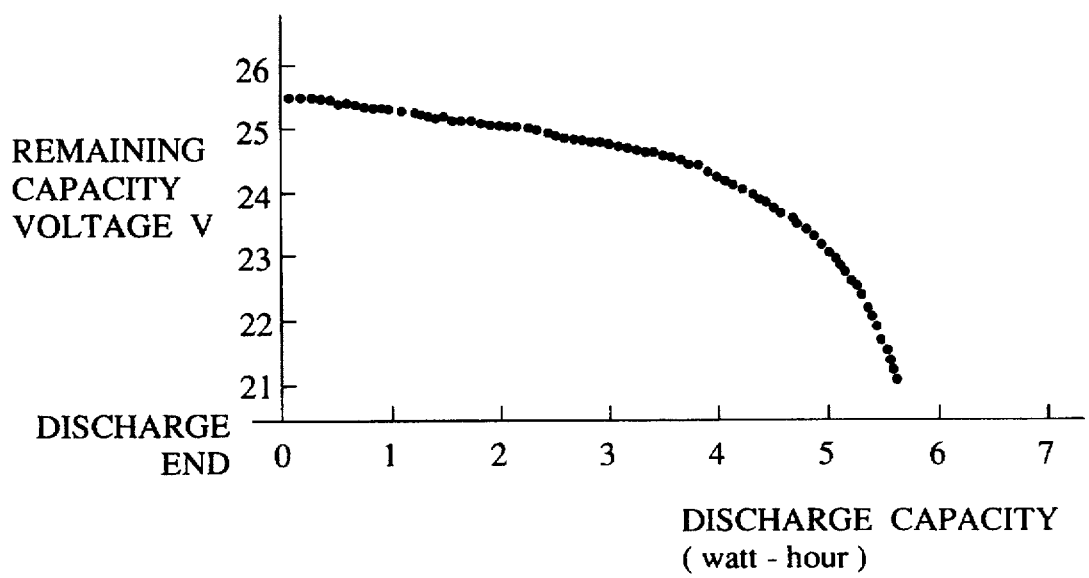
FIG. 9 is a graphical representation showing a dot-display indication used for the remaining battery capacity measuring apparatus according to the present invention.

Whenever the remaining capacity voltage is obtained, the LCD coordinate converting section 110 calculates an ordinate position of an obtained remaining capacity voltage and an abscissa position of a calculated battery discharge rate (watt-hour) on a two-dimensional display screen of the LCD unit 112. Therefore, the remaining capacity voltage (V) and the discharge rate (Wh) can be both indicated in the form of a dot on a two-dimensional display screen. These dots are displayed in sequence in the form of a dot curve with the lapse of time during the travel of the electric vehicle, as shown in FIG. 9. In this case, when the displayed dot is blinked, the driver can know the present battery discharge rate (discharged watt-hour) more clearly on the (V-Wh) coordinates of the LCD unit 112.

Whenever the dot is displayed, the final voltage deciding section 111 discriminates whether the obtained remaining capacity voltage reaches to a final voltage or not. When the remaining capacity voltage reaches a final voltage, the final voltage deciding section 111 stops displaying the dots and displays a numeral of blinking "zero" on the display.

The LCD (liquid crystal display) unit 112 is a coordinate-type (two-dimensional) display of as shown in FIG. 9. In FIG. 9, the ordinate indicates the remaining capacity voltage indicative of the remaining battery capacity (X), which can be obtained by substituting a reference current (Y) for the calculated approximate linear function ($Y=aX+b$). Further, the abscissa indicates a total discharged battery energy (watt-hour), which can be calculated by the discharge rate deciding section 107.

Figure 7:
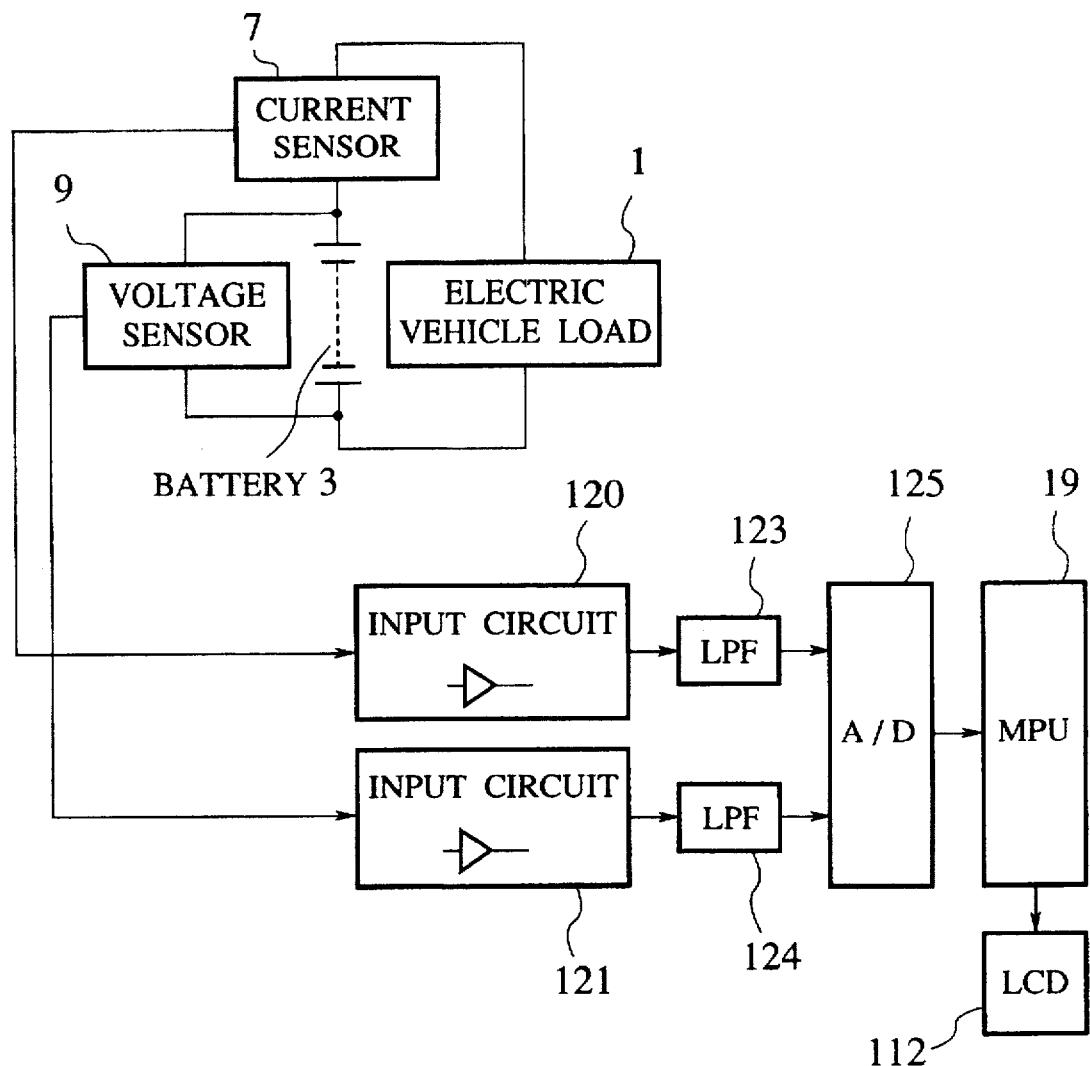
FIG. 7 is a block diagram showing only the essential portion of the second embodiment of the battery capacity measuring apparatus according to the present invention.

FIG. 7 is a more detailed block diagram showing the second embodiment shown in FIG. 6. A first input circuit 120 inputs current values detected by the current sensor 7, and a second input circuit 121 inputs voltage values detected by the voltage sensor 9. Further, a first LPF (low-pass filter) 123 filters the current values, and a second LPF 124 filters the voltage values, respectively. The filter characteristics (filter setting values) are both determined according to the main battery. Therefore, both the noises of the voltage and current signals can be eliminated through these filters on the basis of the filtering characteristics of the filters, respectively.

Further, an A/D converter 25 converts the inputted analog voltage and current signals into digital voltage and current signals corresponding thereto, respectively for each 1 ms, for instance.

The computer 19 is activated by a power of a subsidiary battery whenever an ignition key is turned on. The program function is provided with such hardware functions as the voltage-current change trend calculating section 21, the voltage-current approximate linear function calculating section 25, and the remaining capacity calculating section 23, respectively, as already explained.

The voltage-current change trend calculating section 21 stores the detected voltages and currents in a memory for each sampling time. The discharge rate deciding section 107 calculates a product (watt hour) of the detected current I, the detected voltage V and the detected time interval H. Whenever the calculated discharge rate reaches a constant value (i.e., after the vehicle has traveled at a predetermined distance), the discharge rate deciding section 107 outputs a signal indicative of a constant discharge rate to the voltage-current approximate liner function calculating section 25. Therefore, whenever a constant discharge rate can be obtained, the voltage-current approximate linear function calculating section 8 calculates the approximate linear function ($Y=aX+b$) between the voltages and currents stored in the memory.

Whenever the approximate linear function has been obtained, the remaining capacity calculating section 23 substitutes a reference current ($Y=I_0$) for the approximate linear function, to specify the present remaining capacity voltage of the battery 3.

Whenever the capacity voltage has been obtained, the LCD coordinate converting section 110 calculates the ordinate position of the remaining capacity voltage (V) and the abscissa position of the discharge rate (watt hour) on the V-Wh display screen, and displays a dot corresponding to these calculated coordinates (V-Wh) on the two-dimensional display screen of the LCD unit 112. The total watt-hour is displayed whenever the calculated watt-hour reaches a predetermined watt-hour, after the vehicle has traveled at a distance.

Whenever a dot is displayed on the LCD unit 112, the final discharge deciding section 111 discriminates whether the capacity voltage corresponding to the displayed dot reaches a final voltage. If the capacity voltage reaches the final voltage, the final discharge deciding section 111 displays zero without displaying any dots.

Figure 8:
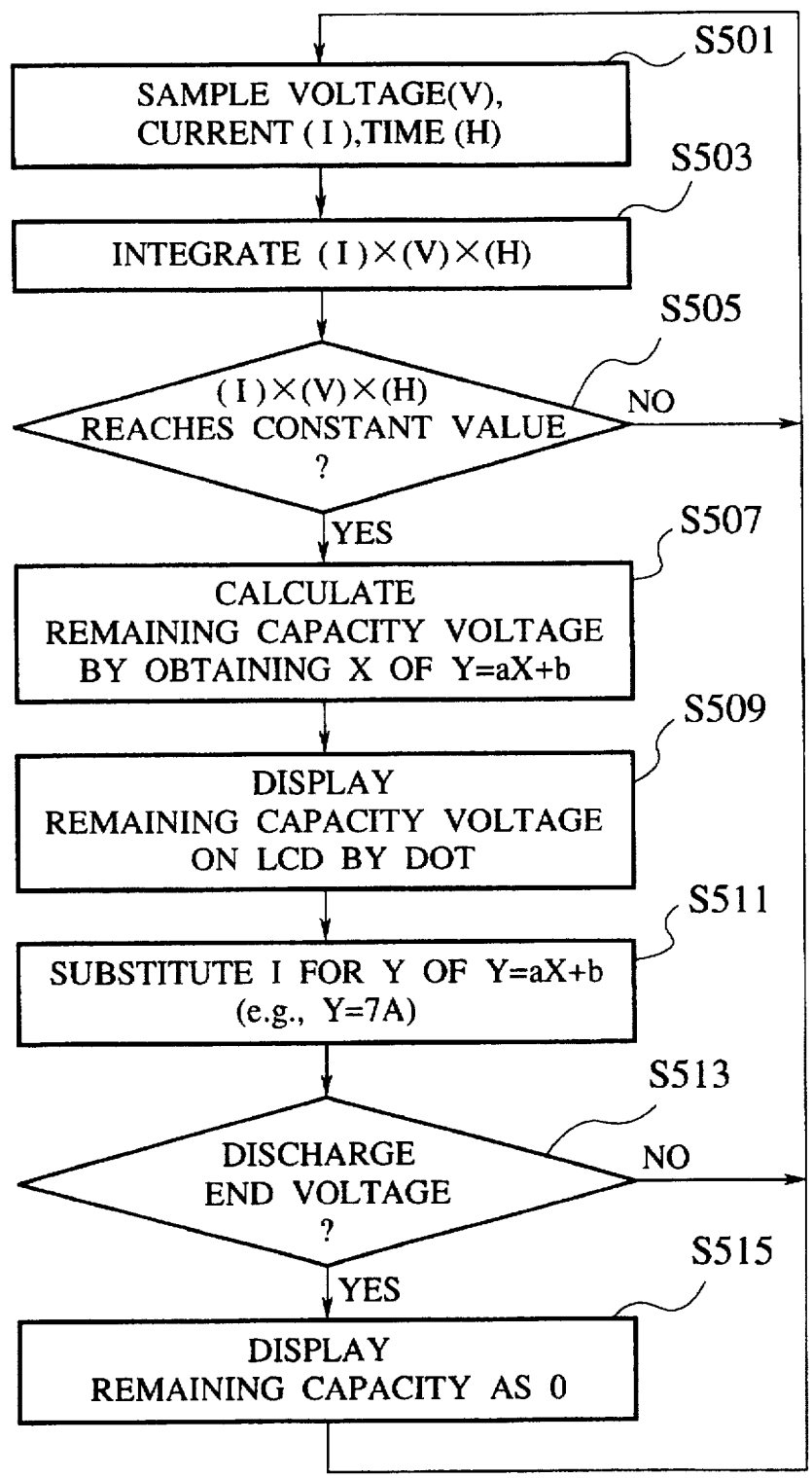
FIG. 8 is a flowchart for assistance in explaining the operation of the second embodiment of the remaining battery capacity measuring apparatus shown in FIG. 6.

The operation of the second embodiment will be described hereinbelow with reference to a flowchart shown in FIG. 8.

When the ignition switch is turned on and then the vehicle starts running, battery terminal voltages and discharge currents flowing from the main battery to the load (motor) are inputted to the two input circuits 120 and 121, filtered through the two LPFs 123 and 124 to eliminate noise, converted from analog signals to digital signals by the A/D converter 125, and then supplied to the computer 19.

The CPU of the computer 19 samples the inputted voltages, currents, and time intervals at predetermined time intervals (e.g., 1 ms), and stored the sampled data in the memory (in step S501).

Further, the CPU calculates a product of the sampled voltage and current and the time interval (I×V×H) to obtain a charge rate (watt-hour) (in step S503).

Further, the CPU discriminates whether the calculated discharge rate reaches a predetermined constant value (in step S505). If not yet reaches a constant discharge rate, the CPU returns to the step S501 to repeat the same processing as described above.

Further, whenever the discharge rate reaches a constant value, the CPU calculates the approximate linear function ($Y=aX+b$) on the basis of a plurality of the dispersive voltages and currents stored in the memory, and specifies a capacity voltage X by substituting a previously determined reference current for Y of the approximate liner function (in step S507).

Further, the CPU converts the obtained capacity voltage (V) and the constant discharge rate (Wh) into (V-Wh) dot coordinates (V-Wh) on the LCD unit 112, and outputs the dot coordinates to the LCD unit 112 (in step S509).

Further, in order to discriminate whether the displayed dot reaches the final discharge voltage, the CPU substitutes a most average current flowing when the vehicle is running) for Y of the approximate linear function during the actual running (in step S511). For instance, the most average current is about 7 A in the case a battery of 35 Ah for 5 hours.

Further, the CPU discriminates whether the displayed dot reaches the final discharge voltage (in step S513). If reaches the final discharge voltage, the CPU stops displaying the remaining capacity by dots, and displays zero "0" on the LCD unit 112 (S515), returning to the step S501. Therefore, the driver can know the main battery is used up.

Further, when the displayed dot does not reach the final discharge voltage, the CPU returns to the step S501 to display the remaining capacity voltage in the form of dots.

In this second embodiment, since the battery capacity voltage indicative of the remaining battery capacity is displayed in the form of dots, the driver can know the remaining battery capacity in the visual sense by watching the dot curve. In other words, it is possible to display the remaining battery capacity for the driver of the electric vehicle, without calculating the total battery capacity.

Further, although the second embodiment has been explained, by taking the case where the remaining capacity of the main battery mounted on the electric vehicle is displayed by way of example, the present embodiment can be of course applied to various batteries of various apparatus.

As described above, in the second embodiment of the remaining battery capacity measuring method and apparatus according to the present invention, the terminal voltages and discharge currents of the battery are sampled; the battery discharge rate (watt-hour) is calculated on the basis of the detected voltages and currents. Further, when the calculated discharge rate reaches a predetermined value, the approximate linear function is obtained on the basis of the sampled terminal voltages and the discharge currents. Further, a remaining capacity voltage is calculated on the basis of a reference discharge current and in accordance with the calculated approximate linear function. Further, the calculated remaining capacity voltage is converted into an ordinate position and further the calculated total watt-hour value is converted into an abscissa position on a two-dimensional display screen of the display unit.

Therefore, it is possible to display the remaining battery capacity automatically in sequence on the display screen in the form of a dot curve with the lapse of time during the travel of the vehicle. Therefore, it is possible to allow the driver to know the change of the remaining battery capacity visually with the lapse of time, even if the total battery capacity is not previously known or the correlation factor is not calculated. Further, when the remaining battery is indicated by turning on or blinking a dot on the V-Wh coordinates of the display screen, it is possible to automatically draw a battery discharge characteristics on the display screen in spite of the simply apparatus construction. Further, when the battery capacity voltage reaches a final voltage, since the battery capacity voltage is reset to a numerical "0" value, the driver can well recognize the necessity of recharging the main battery.

What is claimed is:

1. A remaining battery capacity measuring method, comprising the steps of:

sensing dispersive terminal voltages and dispersive discharge currents from a battery connected to a fluctuating load;

sampling the sensed dispersive terminal voltages and the sensed dispersive discharge currents;

calculating a watt-hour value of the battery for a predetermined time interval on the basis of the sampled dispersive terminal voltages and dispersive discharge currents;

checking whether the calculated watt-hour value reaches a predetermined value;

if the calculated watt-hour value reaches the predetermined value, calculating an approximate linear function indicative of a trend of the sampled dispersive terminal voltages and the sampled dispersive discharge currents;

calculating a voltage corresponding to a reference discharge current in accordance with the calculated approximate linear function as a remaining capacity voltage;

converting the calculated remaining capacity voltage into an ordinate position on a two-dimensional display screen;

converting a calculated total watt-hour value into an abscissa position on the same display screen; and displaying the two converted ordinate and abscissa positions on the display screen in a form of a dot curve.

2. The remaining battery capacity measuring method of claim 1, further comprising the steps of:

for each dot displayed on the dot curve, calculating a check voltage corresponding to a relatively high reference discharge current in accordance with the calculated approximate linear function;

discriminating whether the calculated check voltage reaches a final discharge voltage; and when the check voltage reaches the final discharge voltage, displaying zero on the display screen.

3. A remaining battery capacity measuring apparatus, comprising:

sensing means for sensing dispersive terminal voltages and dispersive discharge currents from a battery connected to a fluctuating load;

voltage-current change trend calculating means for sampling the sensed dispersive terminal voltages and the dispersive discharge currents;

discharge rate deciding means for calculating a watt-hour value of the battery on the basis of the sampled dispersive terminal voltages and dispersive discharge currents, and for determining when the calculated watt-hour value reaches a predetermined value;

voltage-current approximate linear function calculating means for, whenever the calculated watt-hour value reaches the predetermined value, calculating an approximate linear function indicative of a trend of the sampled dispersive terminal voltages and the sampled dispersive discharge currents;

remaining battery capacity calculating means for calculating a voltage corresponding to a reference discharge current in accordance with the approximate linear function calculated by said voltage-current approximate linear function calculating means as a remaining capacity voltage;

coordinate converting means for converting the calculated remaining capacity voltage into an ordinate position on a two-dimensional display screen, and converting a calculated total watt-hour value into an abscissa position on the same display screen; and displaying means for displaying the two converted ordinate and abscissa positions on the display screen in a form of a dot curve.

4. The remaining battery capacity measuring apparatus of claim 3, further comprising discharge end deciding means for calculating, for each dot displayed on the dot curve, a check voltage corresponding to a relatively high reference discharge current in accordance with the calculated approximate linear function, discriminating whether the calculated check voltage reaches a final discharge voltage, and when the check voltage reaches the final discharge voltage, displaying zero on the display screen.

* * * * *